United States Patent
Cattaneo et al.

(10) Patent No.: US 6,323,636 B1
(45) Date of Patent: *Nov. 27, 2001

(54) ELECTRIC CURRENT PICK-UP SHOE

(75) Inventors: Frédéric Cattaneo, Monnetier-Mornex; Pierre Cattaneo, Collonge s/Salève; Guy Vuillermoz, Bellegarde, all of (FR)

(73) Assignee: Liaisons Electroniques-Mecaniques Lem S.A., Plan-les-Ouates (CH)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/462,165

(22) PCT Filed: Apr. 27, 1998

(86) PCT No.: PCT/CH98/00169

§ 371 Date: Jan. 4, 2000

§ 102(e) Date: Jan. 4, 2000

(87) PCT Pub. No.: WO99/01773

PCT Pub. Date: Jan. 14, 1999

(30) Foreign Application Priority Data

Jul. 4, 1997 (CH) .................................................... 1736/97

(51) Int. Cl.[7] ............................ G01R 33/00; G01R 19/20
(52) U.S. Cl. ................. 324/127; 324/117 R; 324/117 H
(58) Field of Search .................................. 324/600, 253, 324/117 R, 127, 117 H

(56) References Cited

U.S. PATENT DOCUMENTS

| | | | |
|---|---|---|---|
| 3,786,356 | * | 1/1974 | MacPhee ................................ 361/45 |
| 3,848,159 | * | 11/1974 | Nye, Jr. et al. ......................... 361/45 |
| 4,208,693 | * | 6/1980 | Dickens et al. ......................... 361/94 |
| 4,808,929 | | 2/1989 | Oldigs . |
| 4,897,561 | * | 1/1990 | Saigo et al. ............................ 307/413 |
| 5,432,444 | * | 7/1995 | Yasohama et al. .................... 324/240 |
| 5,436,557 | | 7/1995 | Erickson . |
| 5,438,257 | * | 8/1995 | Berkcan ........................... 324/117 R |
| 5,442,369 | * | 8/1995 | Van Voorhies et al. ............. 343/742 |
| 5,459,395 | * | 10/1995 | Berkcan ................................ 324/127 |
| 5,463,313 | * | 10/1995 | Berkcan ........................... 324/117 R |
| 5,504,419 | * | 4/1996 | Kull et al. ............................. 323/358 |
| 5,629,616 | * | 5/1997 | Weggel ................................. 324/127 |
| 5,793,196 | * | 8/1998 | White .................................... 324/127 |
| 5,896,028 | * | 4/1999 | Arai .................................. 324/117 H |

FOREIGN PATENT DOCUMENTS

| | | |
|---|---|---|
| 35 12784 A1 | 10/1986 | (DE) . |
| 0294590 | * 8/1993 | (DE) . |
| 0 738 894 A2 | 10/1996 | (EP) . |
| 2 538 120 A1 | 6/1984 | (FR) . |
| 2 128 047 A | 4/1984 | (GB) . |
| WO 96/30773 | 10/1996 | (WO) . |

\* cited by examiner

*Primary Examiner*—Glenn W. Brown
*Assistant Examiner*—Wasseem H. Hamdan
(74) *Attorney, Agent, or Firm*—Clifford W. Browning; Woodard, Emhardt, Naughton, Moriarty & McNett

(57) ABSTRACT

The invention concerns an electric current pick-up shoe compensating fluxes generated in a magnetic circuit (1) by respectively a primary current and a compensating current circulating in a secondary coil. Said secondary coil (5) comprises at its surface a layer of spires (12) forming a protective winding connected to a fixed electric potential (13), such that the effect of leakage capacities between the primary current conductor (4) and the secondary coil (5) winding (6) are practically eliminated.

5 Claims, 2 Drawing Sheets

ELECTRIC CURRENT PICK-UP SHOE

The present invention relates to an electrical current sensor for measuring current flowing in a primary conductor, comprising a magnetic circuit coupled to a secondary coil and arranged such that it may be coupled with the primary conductor, and further comprising means for measuring the magnetic flux in this magnetic circuit, control means for producing a compensation current in the secondary coil in order to cancel said magnetic flux and means for measuring the compensation current.

Such sensors are often used in power supply circuits in which the current to be measured is switched at high frequency. A typical example is the supply of an asynchronous motor from a three phase inverter bridge, the sensors being placed on the three lines connecting the motor phases to the inverter bridge.

The switching speeds can attain very high values that lead, for example, to voltage variations in the order of 10 kV/$\mu$s and more.

Since these voltage variations are found on the primary conductors of sensors, leak capacitances between these conductors and the corresponding secondary coils may lead to very large parasitic currents. These leak capacitances are particularly high in sensors of small dimensions as they result from miniaturisation developments in this field. Moreover, insulation and sealing are often ensured by the introduction of a moulding resin inside the sensor. Leak capacitances in the order of 5 to 10 pF may thus exist between the primary conductor and the secondary coil, resulting in the appearance of leak currents reaching 50 to 100 mA during a transition corresponding to a voltage variation of 10 kV/$\mu$s. Such values lead to extremely high measurement errors.

An existing solution consists in providing a shield in the form of copper foil connected to a fixed potential and arranged around the primary conductor. This solution has the disadvantage of providing insufficient protection because the shielding does not completely surround the primary conductor nor the secondary coil and thus allows non-negligible residual leak capacitances to subsist. Moreover, the provision and particularly the connect ion to a fixed potential of this shielding is neither simple nor cheap.

Another solution consists in placing, a round the secondary coil, a copper foil insulated on both of its faces and bordered in such a manner as to avoid shortcircuiting the windings. This method is however very costly, particularly in the case where the secondary coil is a tore and especially if the diameter of the tore is small.

According to a first aspect of the invention, an object is to overcome these disadvantages and to provide a current sensor in which the effects of leak capacitances between the primary conductor and the secondary coil are practically totally eliminated by very simple and economic means.

To this effect, the current sensor according to the invention is characterized in that the secondary coil comprises, at the surface of a winding through which the compensation current flows, at least one layer of insulated wire spires forming an open protective winding connected as a whole to a point of fixed electrical potential.

Preferably, the spires of the protective winding are interconnected.

According to another aspect of the invention, a sensor of the above mentioned type comprises, on the one hand, an opening through the inside of the magnetic circuit in order to allow insertion of at least a first primary conductor and, on the other hand, two or more separate portions of primary conductor partially surrounding respective sections of the magnetic circuit, these conductor portions being arranged such that they may be connected, at the exterior of the sensor, individually, in series, in parallel or in series-parallel to at least a second primary conductor.

The separate portions of primary conductor are preferably portions in the form of a U, whereby the extremities are arranged such that they enable assembly of said portions on a circuit board exterior to the sensor for their electrical connection and/or for supporting the sensor.

Such an arrangement aims particularly to provide a sensor that may be used for the differential measure of two primary currents of opposite direction, flowing respectively in a conductor traversing said opening and in at least one of said separate portions of primary conductor.

This aspect of the invention results, in particular, in very good insulation between the primary conductors coupled to the sensor, by passing through said sensor opening and by means of said separate portions of primary conductor, respectively.

The above described arrangements relating to protecting the secondary winding and insulating the separate primary conductors may advantageously be combined in the same sensor.

Other particularities, advantages and goals of the present invention will be apparent from the description of an embodiment given by way of example and referring to the annexed drawings, in which FIG. 1 shows schematically and partially, in section, a current sensor according to the invention;

Figure 1:
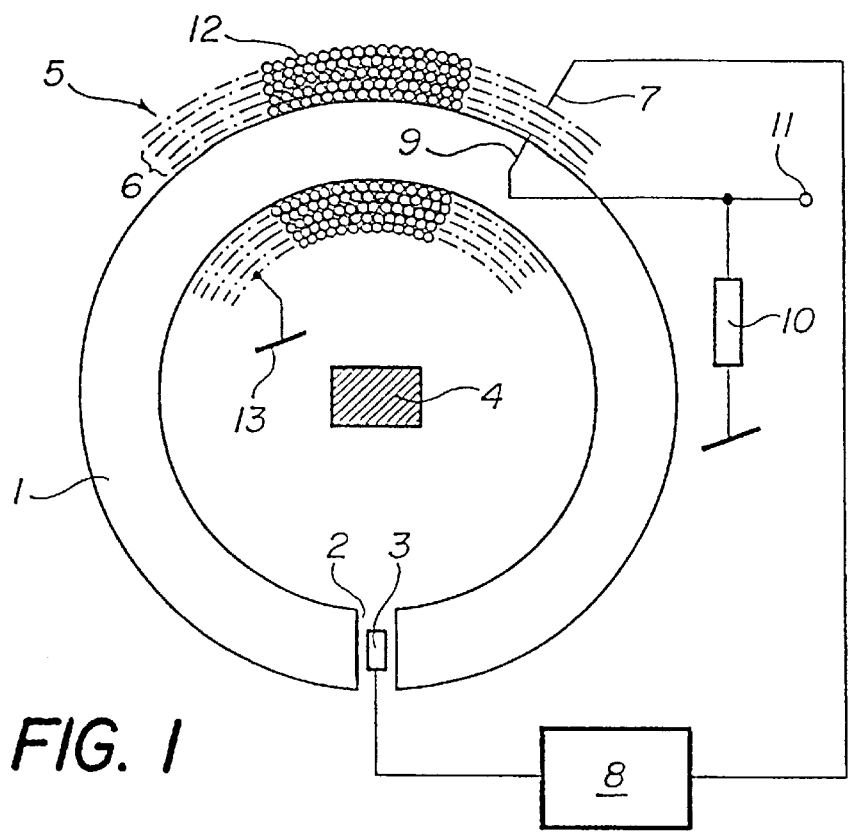
Figure 2:
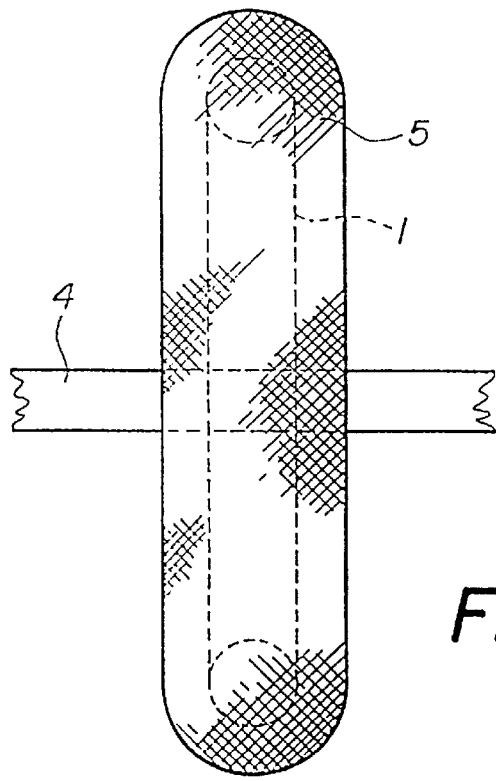
FIG. 2 is a lateral view of a secondary winding and primary conductor of FIG. 1.

The sensor illustrated in FIGS. 1 and 2 comprises a closed magnetic circuit 1 in the form of a tore made of a material having a good magnetic permeability, this tore having an air-gap 2 in which a magnetic field detector 3 is positioned.

A primary conductor 4 traverses the magnetic circuit 1 approximately at the center of the tore. The tore carries a secondary coil 5 which comprises several layers of a secondary winding 6. The extremity 7 of the winding 6 is connected to the output of a control circuit 8 whose input is connected to the detector 3 which provides a measuring signal of the magnetic flux in the circuit 1.

The output of the control circuit 8 provides a compensation current to the secondary winding 6 which seeks to eliminate the magnetic flux generated in the circuit 1. This compensation current is measured at the extremity 9 of the winding 6 by the drop in voltage across a measuring resistance 10, an image of the primary current thus appearing at the terminal 11.

According to the present invention, the secondary winding 6 is surrounded on its external surface by at least one layer of spires, preferably interconnected, which form a protective winding 12 providing an electrical shield, particularly with respect to the conductor 4. To this effect, the winding 12 is open and is connected as a whole to a fixed electrical potential such as that of the earth 13.

The winding 12 which is for example made of varnished wire for insulation and which may be the same wire as that used for the secondary winding 6, covers the whole of the winding 6 such that almost no parasite current is generated in the secondary coil due to voltage variations of the primary conductor.

The arrangement according to the invention thus provides a perfect shield and is moreover advantageously very economical since the protective winding may be made in a similar manner to that of the secondary winding.

Figure 3:
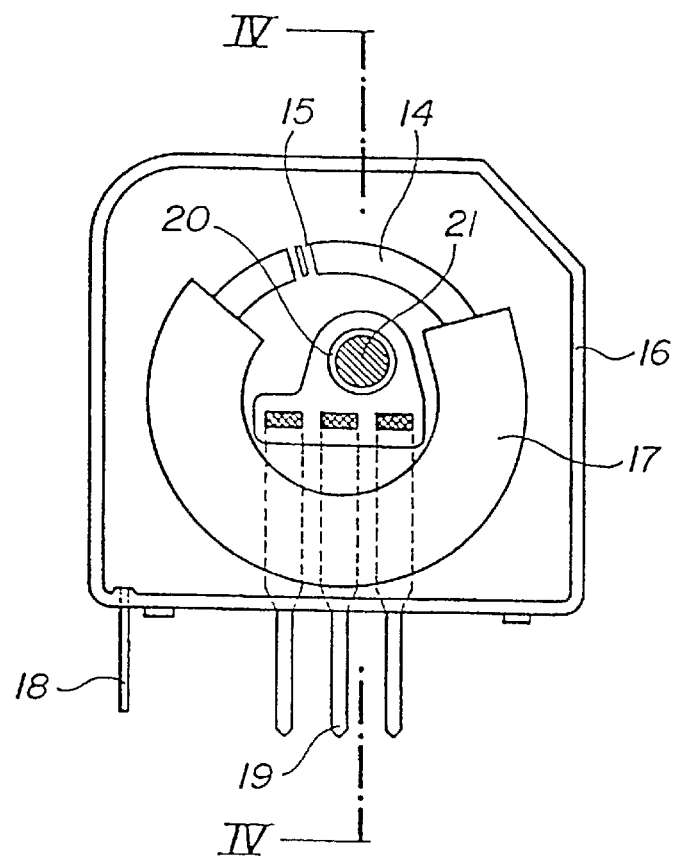
FIG. 3 is a front view of a particular embodiment of a current sensor according to the invention.
Figure 4:
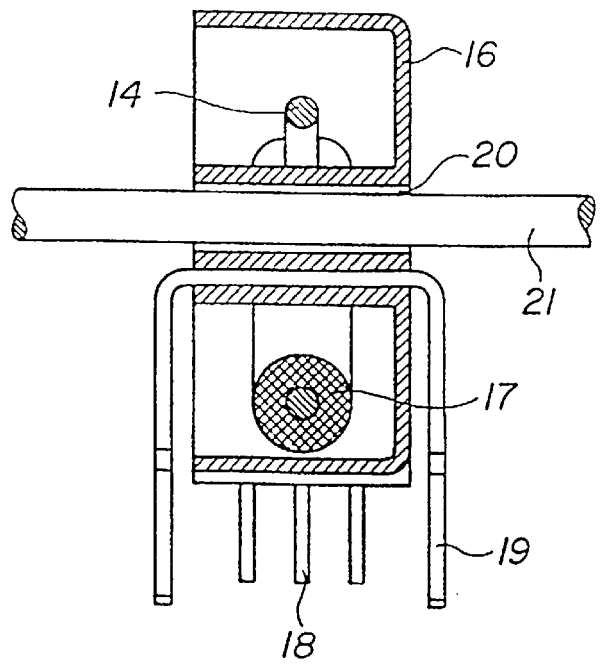
FIG. 4 is a view in section through line IV—IV of FIG. 1.

FIGS. 3 and 4 show an embodiment of a sensor enabling in particular the differential measure of two currents of opposite direction flowing through primary conductors which are well insulated with respect to each other.

A magnetic circuit in the form of a tore 14 having an air-gap 15 is arranged in a housing 16 of the sensor. This magnetic circuit carries a secondary coil 17 comprising at least one secondary winding connected to terminals, such as pins 18, for connection to an external circuit, for example on a printed circuit board (not shown). The pins 18 may also serve to connect the Hall effect cell positioned in the air-gap 15 and a protective winding as described above.

According to FIGS. 3 and 4, the sensor comprises three conductor portions in the form of a U, as represented by numeral 19, passing through the interior of the magnetic circuit 14. These conductor portions may be connected to a primary conductor either individually, in parallel, in series, or in series-parallel. This conductor may thus be coupled to the magnetic circuit by forming two spires around the tore 14 having the secondary coil 17.

Moreover, the housing 16 comprises an opening 20 through which passes a primary conductor 21 traversing the magnetic circuit 14. This conductor 21 may be provided with its own insulation such that it withstands a high voltage with respect to the three primary conductor portions 19.

The arrangement according to FIGS. 3 and 4 thus enables use of such a sensor either for measuring a primary current flowing through the conductor 21 or through one or more conductor portions 19, or for the differential measure of currents flowing, respectively, through the conductor 21 and through one or more portions 19. The extremities of these portions 19 serve as electrical connections to the corresponding primary conductor as well as to support the sensor on a external circuit board.

What is claimed is:

1. An electrical current sensor for measuring current flowing through a primary conductor (4,19,21), comprising a magnetic circuit (1) coupled to a secondary coil (5), the magnetic circuit forming an opening through which the primary conductor (4,19,21) extends means (3) for measuring the magnetic flux in the magnetic circuit, control means (8) arranged to produce, in the secondary coil, a compensation current seeking to eliminate said magnetic flux, and means (10) for measuring said compensation current, characterized in that the sensor comprises, at an outer surface of said secondary coil through which the compensation current flows, an electrical shield comprising at least one layer of spires made of insulated wire forming a protective winding (12) electrically insulated from the secondary coil through which the compensation current flows, and connected as a whole to a point of fixed electrical potential (13).

2. Current sensor according to claim 1, characterized in that the spires of the protective winding (12) are interconnected.

3. Current sensor according to claim 1, characterized in that it comprises a housing (16) having a portion comprising an opening (21) extending through the opening formed by the magnetic circuit so as to enable insertion of at least a first primary conductor, and two or more separate primary conductor portions partially surrounding respective sections of the magnetic circuit, said conductor portions having connection ends for connection externally of the sensor, individually, in series, in parallel or in series-parallel to at least a second primary conductor.

4. Current sensor according to claim 3, characterized in that said separate primary conductor portions are portions in the form of a U whose extremities are arranged so as to enable assembly of these portions on a circuit board external to the sensor for their electrical connection and/or for supporting the sensor.

5. Use of a sensor according to claim 3 for the differential measure of two primary currents of opposite direction, flowing respectively through a conductor traversing said opening and through at least one of said separate primary conductor portions.

\* \* \* \* \*